United States Patent
Okunuki (10) Patent No.: US 8,233,514 B2
(45) Date of Patent: Jul. 31, 2012

(54) SEMICONDUCTOR LASER DEVICE

(75) Inventor: Yuichiro Okunuki, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 0 days.

(21) Appl. No.: 13/309,120

(22) Filed: Dec. 1, 2011

(65) Prior Publication Data

US 2012/0076168 A1    Mar. 29, 2012

Related U.S. Application Data

(62) Division of application No. 12/572,323, filed on Oct. 2, 2009, now Pat. No. 8,094,696.

(30) Foreign Application Priority Data

Mar. 25, 2009    (JP) .................................. 2009-074678

(51) Int. Cl.
    *H01S 5/00*    (2006.01)
(52) U.S. Cl. .................................. 372/45.01; 372/49.01
(58) Field of Classification Search ............... 372/45.01, 372/49.01
    See application file for complete search history.

(56) References Cited

U.S. PATENT DOCUMENTS

| 4,951,291 A | * | 8/1990 | Miyauchi et al. .......... 372/49.01 |
| 5,841,584 A | | 11/1998 | Takatani et al. |

FOREIGN PATENT DOCUMENTS

| JP | 60-130187 A | | 7/1985 |
| JP | 61-207091 A | | 9/1986 |
| JP | 63-220589 A | | 9/1988 |
| JP | 63-162558 U | | 10/1988 |
| JP | 4-18784 A | | 1/1992 |
| JP | 7-45910 A | | 2/1995 |
| JP | 07045910 A | * | 2/1995 |
| JP | 8-298351 A | | 11/1996 |
| JP | 10-290052 A | | 10/1998 |

OTHER PUBLICATIONS

Explanation of product sample.
State Intellectual Property Office of the People's Republic of China, Office Action in Chinese Patent Application 200910253156.X (Apr. 6, 2012).

* cited by examiner

*Primary Examiner* — Patrick Stafford
(74) *Attorney, Agent, or Firm* — Leydig, Voit & Mayer, Ltd.

(57) ABSTRACT

A semiconductor laser according to the present invention comprises a $\lambda/2$ dielectric film ($\lambda$:in-medium wavelength of a dielectric film, for example, $SiO_2$, $Si_3N_4$, $Al_2O_3$, and AlN) in contact with a facet of a resonator; and a first dielectric double layered film disposed on the dielectric film, which includes a first layer of a-Si and a second layer of a material having a refractive index lower than that of a-Si. The first layer has a thickness ¼ of an in-medium wavelength of a-Si, and the second layer has a thickness ¼ of an in-medium wavelength of the second layer. Therefore, it is possible to firmly stack the first dielectric double layered film and form a high reflectance film with high yield.

2 Claims, 4 Drawing Sheets

SEMICONDUCTOR LASER DEVICE

BACKGROUND OF THE INVENTION

1. Field of the Invention

The present invention relates to a semiconductor laser device, and more particularly, to a semiconductor laser device used for optical communication, having a wavelength of 1250 nm or more and provided with a dielectric film on a resonator facet of a semiconductor laser.

2. Description of the Related Art

As the amount of communication demand drastically increases, efforts are being made to realize large capacity communication systems. Transmission systems in optical communication mainly use 1.3 µm band signal light and 1.55 µm band signal light.

The 1.55 µm band signal light involves only small optical fiber loss and is used as signal light in a long-distance communication system. This is called "interurban communication (trunk system)" and used for communication between megalopolises, for example, between Tokyo and Osaka.

On the other hand, the 1.3 µm band signal light involves greater optical fiber loss but has less wavelength dispersion and is used as signal light in a short-distance communication system. This is called, for example, "intra-urban communication" and used for communication within a megalopolis. Furthermore, the 1.3 µm band signal light is also used for communication between a base station and individual households called an "access system."

Long-wavelength semiconductor lasers that generate signal light having a wavelength of 1.25 µm or more including such signal light are also required to perform high-speed response at a low operating current.

Facet emitting semiconductor lasers are normally used as long-wavelength semiconductor lasers for optical communication. An facet emitting semiconductor laser generally has a pair of mutually opposed facets formed in a crystal by cleaving or etching, allows light to travel between the facets through reflection and thereby obtains light feedback necessary for laser oscillation. Such a semiconductor laser is known as a Fabry-Perot semiconductor laser.

In addition, lasers such as a distributed feedback semiconductor laser using a diffraction grating and distributed reflector semiconductor laser are known, and many such lasers have a structure using reflection on an facet in addition to light feedback using a diffraction grating.

For example, the semiconductor laser body of a Fabry-Perot semiconductor laser has a resonator having a multilayered structure of an n-type clad layer, active layer and p-type clad layer. A single-layer film made of $Al_2O_3$ and having a thickness of $\lambda/2$ is formed on the front facet of this resonator.

Here, $\lambda$ is an in-medium wavelength and defined as $\lambda$=(wavelength in vacuum of light that emits from the semiconductor laser body)÷(refractive index of medium through which laser light propagates).

When a single-layer film made of $Al_2O_3$ and having a thickness of $\lambda/2$ is formed on the facet of the resonator, the reflectance of light on the facet is determined by a refractive index of the semiconductor making up the resonator with respect to air. For example, when the refractive index of the semiconductor is 3.2, the reflectance is on the order of 30%.

Furthermore, a multilayer film made up of, for example, an $SiO_2$ film and Si film is formed on a rear facet of the resonator. In the case of a multilayer film composed of three layers of an $SiO_2$ film, Si film and $SiO_2$ film, each layer having a thickness of $\lambda/4$, the reflectance becomes approximately 60%. When two layers of a Si film and $SiO_2$ film are additionally stacked outside the $SiO_2$ film, the reflectance becomes approximately 90%.

Furthermore, in the case of a distributed feedback semiconductor laser, for example, a diffraction grating is provided along an active layer of the resonator and an antireflection film is formed on the front facet and a high reflection film similar to a Fabry-Perot semiconductor laser is formed on the rear facet.

Laser oscillation is generally started when a current equal to or higher than a predetermined value is passed through a semiconductor laser. The current value in this case is called a "threshold current." The threshold current is a current that does not contribute to light emission of the laser and is generally preferred to be low. The threshold current corresponds to a current value at which a gain produced by current injection is balanced with resonator loss. Here, the resonator loss is the sum of internal loss (absorption loss or the like) and mirror loss.

The mirror loss is greater as the reflectance of the facet is lower, and therefore increasing the reflectance of the facet causes the mirror loss to decrease and can reduce the threshold current.

Furthermore, in the case of a distributed feedback semiconductor laser or distributed reflector semiconductor laser, the degree of influence of a diffraction grating on light (normalized coupling coefficient) also has a large influence on mirror loss and the facet reflectance also has a large influence. However, as for the normalized coupling coefficient, increasing the normalized coupling coefficient allows mirror loss to be reduced.

However, increasing the reflectance of the facet of any semiconductor laser causes light density on the facet to increase.

For example, with regard to a Fabry-Perot semiconductor laser, the light density on the front facet of a Fabry-Perot semiconductor laser having a front facet reflectance of 60% and rear facet reflectance of 90% is approximately double that of a Fabry-Perot semiconductor laser having a front facet reflectance of 30% and rear facet reflectance of 60% when light outputs are the same.

Furthermore, in a distributed feedback semiconductor laser using an antireflection film for the front facet and a high reflection film for the rear facet, though the light density also depends on the phase of the diffraction grating on the rear facet, there are many device whose light density on the rear facet increases. This tendency becomes noticeable especially when the normalized coupling coefficient is increased in order to reduce a threshold current or when the reflectance of the rear facet is increased, and when assuming that the normalized coupling coefficient is 1.4, the front facet reflectance is 0% and the rear facet reflectance is 90%, the light density on the rear facet is approximately seven times that of the front facet at maximum.

On the other hand, the interface between the semiconductor and the facet coating film is generally a location where there are many interface states and laser deterioration is most likely to occur, and if the facet coating film is designed so that the electric field strength of light at this location becomes a maximum, such an interface is likely to cause deterioration of the laser.

For example, in the case of a resonator of a Fabry-Perot semiconductor laser, a high reflection film is disposed on the rear facet of the resonator as follows. That is, this is a high reflection film in which an $SiO_2$ film of a first layer having a thickness ¼ of in-medium wavelength $\lambda$ is placed in close contact with the rear facet of the resonator, an amorphous Si (hereinafter described as "a-Si") film of a second layer having a thickness of λ/4 is superimposed thereon and an SiO$_2$ film of a third layer having a thickness of λ/4 is further superimposed thereon.

In other words, this high reflection film is made up of a low refractive index film having a thickness of λ/4 in close contact with the facet, a high refractive index film having a thickness of λ/4 and a low refractive index film having a thickness of λ/4 on the rear facet of the resonator.

In this case, the electric field strength distribution in the vicinity of the rear facet of the resonator and on the reflection film becomes a maximum at the interface between the rear facet of the resonator and the SiO$_2$ film of the first layer, becomes a minimum at the interface between the SiO$_2$ film of the first layer and the a-Si film of the second layer, becomes a maximum at the interface between the a-Si film of the second layer and the SiO$_2$ film of the third layer and becomes a minimum at the interface between the SiO$_2$ film of the third layer and the air layer.

Since the maximum value at the interface between the a-Si film of the second layer and the SiO$_2$ film of the third layer is smaller than the maximum value at the interface between the rear facet of the resonator and the SiO$_2$ film of the first layer, the electric field strength at the interface formed of different kinds of materials becomes highest at the interface between the rear facet of the resonator and the SiO$_2$ film of the first layer.

For example, the configuration of a high reflection film of a publicly known long-wavelength laser uses a five-layer structure of SiO$_2$/amorphous Si/SiO$_2$/amorphous Si/SiO$_2$ on the facet formed using a cleaving method, and a reflectance of 90% or more is obtained in this way. Alternatively, a λ/4 film made of SiN is formed on the facet, amorphous Si/SiN/amorphous Si/SiN are multilayered on this and a high reflection film having a five-layer structure of SiN/amorphous Si/SiN/amorphous Si/SiN and having a reflectance of 90% is formed (e.g., see Japanese Patent Laid-Open No. 10-290052, paragraphs 0056 and 0057).

The high reflection film in this case is composed of five layers; a low refractive index film having a thickness of λ/4 in close contact with the facet, a high refractive index film having a thickness of λ/4, a low refractive index film having a thickness of λ/4, a high refractive index film having a thickness of λ/4 and a low refractive index film having a thickness of λ/4.

To reduce electric field strength at an interface between facets of a resonator, a semiconductor laser having the following configuration is known.

In this configuration, a dielectric film having a film thickness value of λ/4nc formed of amorphous silicon (refractive index nc to 3.5) having substantially the same refractive index as that of a laser element is provided on the light emission facet of a GaAlAs-based semiconductor laser and a plurality of sets of low refractive index reflection films having a thickness of λ/2nd made up of a dielectric film having a low refractive index (nd) such as an SiO$_2$ film and high refractive index reflection films having a high refractive index are alternately arranged in close contact with the dielectric film of this amorphous silicon. This configuration reduces the electric field strength of light on the light emission facet to a minimum value (e.g., see Japanese Patent Laid-Open No. 63-220589, bottom left field and bottom right field on p. 2).

Furthermore, there is disclosed an example of a semiconductor laser whose oscillating wavelength is approximately 740 nm where an Al$_2$O$_3$ film or SiO$_2$ film having an optical thickness of λ/2 is provided in contact with an facet and multilayered pairs of TiO$_2$ layer and SiO$_2$ layer having an optical thickness of λ/4 are sequentially arranged on the Al$_2$O$_3$ film or SiO$_2$ film of λ/2; three pairs on the light emerging facet side and six pairs on the reflection surface side, which is the opposite side (e.g., Japanese Patent Laid-Open No. 7-45910, paragraphs 0010 and 0011).

Furthermore, when multilayer coating is applied to a semiconductor laser device, a dielectric such as Al$_2$O$_3$, SiO$_2$ or Si$_3$N$_4$ is coated as an odd-numbered layer and Si is coated as an even-numbered layer, but when Si is used for the top layer, Si is oxidized easily, and therefore there is described an example where Si, Al$_2$O$_3$, Si and Al$_2$O$_3$ are sequentially stacked on a cavity facet of a GaAs—GaAlAs-based semiconductor laser having an oscillating wavelength of 8300 Å and an Al$_2$O$_3$ layer is provided on the top layer so as to prevent Si from being oxidized (e.g., Japanese Patent Laid-Open No. 60-130187, from right field on p. 1 to left field on p. 2).

Furthermore, there is disclosed an example where an AlN film is used instead of an Al$_2$O$_3$ film in close contact with an facet of a high output type semiconductor laser element having a large calorific value (e.g., Japanese Utility Model Laid-Open No. 63-162558).

Thus, in order to reduce a threshold current, increasing a reflectance on the facet of a resonator or increasing a normalized coupling coefficient of a diffraction grating causes a light density on the facet of the resonator to increase. Furthermore, in the case of a configuration where electric field strength of light at the interface between the facet of the resonator and reflection film becomes a maximum, when not only the light density on the facet of the resonator is high but also the electric field strength of light becomes a maximum, reliability drastically deteriorates, for example, deterioration of the semiconductor laser is more likely to occur. Furthermore, when mechanical strength at the interface between the facet of the resonator and reflection film is low, heating during assembly of the semiconductor laser device may cause peeling at the interface, leading to a decrease of yield. As such, the configuration of the above described conventional semiconductor laser has a difficulty in simultaneously achieving a reduction of a threshold current and high reliability and may also result in low yield.

In the configuration of the high reflection film of the conventional long-wavelength semiconductor laser described above, when the high reflection film is made up of five layers; a low refractive index film having a thickness of λ/4 in close contact with the facet, high refractive index film having a thickness of λ/4, low refractive index film having a thickness of λ/4, high refractive index film having a thickness of λ/4 and low refractive index film having a thickness of λ/4, as described in Japanese Patent Laid-Open No. 10-290052, there is a problem that the electric field strength of light at the interface between the facet of the resonator and the low refractive index film of the first layer does not always become a minimum value and the electric field strength of light rather increases.

Furthermore, when an a-Si film is formed on the facet of the resonator as described in Japanese Patent Laid-Open No. 63-220589, the adherence of the semiconductor making up the resonator to a-Si Si is not necessarily good. When a laser chip is assembled in a package, heat of soldering is applied thereto, and therefore there is a problem that when the adherence of the a-Si film to the facet of the resonator is insufficient, thermal stress applied thereto may cause the a-Si film on the facet of the resonator to peel off. Furthermore, when a high reflection film is configured, many pairs of low refractive index film and high refractive index film need to be superimposed one upon another, but when the adherence of the a-Si film to the facet of the resonator is insufficient, it may be difficult to superimpose many pairs of low refractive index film and high refractive index film one upon another, resulting in a problem that the yield deteriorates.

Furthermore, as described in Japanese Patent Laid-Open No. 7-45910, when a high reflection film is configured by stacking multilayer pairs of $TiO_2$ layer as the high refractive index film and $SiO_2$ layer as the low refractive index film, in the case of a long-wavelength laser having a wavelength three times or more the wavelength described in Japanese Patent Laid-Open No. 7-45910, it is necessary to stack seven pairs of $TiO_2$ film and $SiO_2$ film to obtain a reflectance of 80% or more in a combination of $TiO_2$ whose refractive index is merely on the order of 2 and $SiO_2$ whose refractive index is 1.40 to 1.45. In this case, there is a problem that the facet coating film becomes extremely thick and peeling of the film is more likely to occur due to thermal stress during assembly.

SUMMARY OF THE INVENTION

The present invention has been implemented to solve the above described problems and it is a first object of the present invention to provide a semiconductor laser device that makes deterioration less likely to occur in the vicinity of an interface between an facet of a resonator of a semiconductor laser and a reflection film and provides a low threshold current and high yield.

According to one aspect of the present invention, there is provided a semiconductor laser device comprising: a compound semiconductor laser body having an resonator with facets mutually opposed; a dielectric film of any one material of $SiO_2$, $Si_3N_4$, $Al_2O_3$ and AlN disposed on one of the facets of the resonator, and in close contact with the facet of the resonator, the dielectric film having a thickness obtained by dividing by 2 a positive integer multiple of a first in-medium wavelength determined by a first refractive index of the material composing the dielectric film and a wavelength of emitted light of the compound semiconductor laser body; and a first dielectric double layered film on the dielectric film, having a first layer of amorphous silicon and a second layer of a material having a third refractive index lower than a second refractive index of amorphous silicon, the first layer being closer to the dielectric film than the second layer, and having a thickness ¼ of a second in-medium wavelength determined by the second refractive index and the wavelength of the emitted light, and the second layer having a thickness ¼ of a third in-medium wavelength determined by the third refractive index and the wavelength of the emitted light.

Accordingly, in the semiconductor laser according to the present invention, the dielectric film is formed of any one material of $SiO_2$, $Si_3N_4$, $Al_2O_3$ and AlN, and therefore bonding strength is high at the interface between the facet of the resonator and dielectric film and the interface between the dielectric film and a-Si which is the first layer of the first dielectric double layered film, and it is thereby possible to firmly stack the first dielectric double layered film and form a high reflectance film with high yield. Furthermore, the electric field strength of light at the interface between the facet of the resonator and the dielectric film and at the interface between the dielectric film and a-Si which is the first layer of the first dielectric double layered film displays a minimum value, light absorption at these interfaces is suppressed and the occurrence of COD (Catastrophic Optical Damage) can be suppressed. Moreover, it is possible to provide a semiconductor laser device having a low threshold current, making deterioration less likely to occur in the vicinity of the interface between the facet of the resonator and the reflection film and providing high reliability and high yield.

According to another aspect of the present invention, there is provided a semiconductor laser device comprising: a compound semiconductor laser body having an resonator with facets mutually opposed; a dielectric film of any one material of $SiO_2$, $Si_3N_4$ and AlN disposed on one of the facets of the resonator, and in close contact with the facet of the resonator, the dielectric film having a thickness ¹⁄₂₅ or less of a first in-medium wavelength determined by a first refractive index of the material composing the dielectric film and a wavelength of emitted light of the compound semiconductor laser body; and a first dielectric double layered film on the dielectric film, having a first layer of amorphous silicon and a second layer of a material having a third refractive index lower than a second refractive index of amorphous silicon, the first layer being closer to the dielectric film than the second layer, and having a thickness ¼ of a second in-medium wavelength determined by the second refractive index and the wavelength of the emitted light, and the second layer having a thickness ¼ of a third in-medium wavelength determined by the third refractive index and the wavelength of the emitted light.

Accordingly, in the semiconductor laser according to the present invention, the dielectric film is formed of any one material of $SiO_2$, $Si_3N_4$ and AlN, and therefore bonding strength is high at the interface between the facet of the resonator and dielectric film and the interface between the dielectric film and a-Si which is the first layer of the first dielectric double layered film, and it is thereby possible to firmly stack the first dielectric double layered film and form a high reflectance film with high yield. Furthermore, since the dielectric film has a thickness ¹⁄₂₅ or less of the first in-medium wavelength determined by the first refractive index and the wavelength of emitted light of the compound semiconductor laser body, by causing electric field strength of light at the interface between the facet of the resonator and the dielectric film to approximate to a minimum value, it is possible to suppress light absorption at this interface, improve heat dissipation in the vicinity of this interface and further suppress the occurrence of COD. Moreover, it is possible to provide a semiconductor laser device having a low threshold current, making deterioration less likely to occur in the vicinity of the interface between the facet of the resonator and the reflection film and providing high reliability and high yield.

According to further aspect of the present invention, there is provided a semiconductor laser device comprising: a compound semiconductor laser body having an resonator with facets mutually opposed; a dielectric film of any one material of $SiO_2$, $Si_3N_4$, $Al_2O_3$ and AlN disposed on one of the facets of the resonator, and in close contact with the facet of the resonator, the dielectric film having a thickness obtained by dividing by 2 a positive integer multiple of a first in-medium wavelength determined by a first refractive index of the material composing the dielectric film and a wavelength of emitted light of the compound semiconductor laser body; and a first dielectric double layered film on the dielectric film, having a first layer of amorphous silicon and a second layer of a material having a third refractive index lower than a second refractive index of amorphous silicon, the first layer being closer to the dielectric film than the second layer, and having a thickness exceeding ¼ of a second in-medium wavelength determined by the second refractive index and the wavelength of the emitted light and less than ½ of the second in-medium wavelength, and the second layer having a thickness less than ¼ of a third in-medium wavelength determined by the third refractive index and the wavelength of the emitted light.

Accordingly, in the semiconductor laser according to the present invention, this configuration can reduce the electric field strength of light at the interface between different kinds of materials constituting the second dielectric double layered film and further improve reliability against COD. Moreover, this configuration can provide a semiconductor laser device making deterioration less likely to occur in the vicinity of the interface between the facet of the resonator and reflection film and having a low threshold current and high yield.

According to still further aspect of the present invention, there is provided a semiconductor laser device comprising: a compound semiconductor laser body having an resonator with facets mutually opposed; a dielectric film of any one material of $SiO_2$, $Si_3N_4$, $Al_2O_3$ and AlN disposed on one of the facets of the resonator, and in close contact with the facet of the resonator, the dielectric film having a thickness $\frac{1}{25}$ or less of a first in-medium wavelength determined by a first refractive index of the material composing the dielectric film and a wavelength of emitted light of the compound semiconductor laser body; and a first dielectric double layered film on the dielectric film, having a first layer of amorphous silicon and a second layer of a material having a third refractive index lower than a second refractive index of amorphous silicon, the first layer being closer to the dielectric film than the second layer, and having a thickness exceeding $\frac{1}{4}$ of a second in-medium wavelength determined by the second refractive index and the wavelength of the emitted light and less than $\frac{1}{2}$ of the second in-medium wavelength, and the second layer having a thickness less than $\frac{1}{4}$ of a third in-medium wavelength determined by the third refractive index and the wavelength of the emitted light.

Accordingly, in the semiconductor laser according to the present invention, this configuration causes the dielectric film to be formed of any one material of $SiO_2$, $Si_3N_4$, $Al_2O_3$ and AlN, and thereby increases the bonding strength at the interface between the facet of the resonator and the dielectric film and at the interface between the dielectric film and a-Si which is the first layer of the first dielectric double layered film, can firmly stack the first dielectric double layered film and form the high reflectance film with high yield. Furthermore, the dielectric film has a thickness $\frac{1}{25}$ or less of the first in-medium wavelength determined by the first refractive index and the wavelength of emitted light of the compound semiconductor laser body, and therefore by causing the electric field strength of light at the interface between the facet of the resonator and the dielectric film to approximate to a minimum value, the present embodiment can suppress light absorption at the interface, improve heat dissipation in the vicinity of this interface and further suppress the occurrence of COD.

According to still further aspect of the present invention, there is provided a semiconductor laser device comprising: a compound semiconductor laser body having an resonator with facets mutually opposed; a dielectric film of any one material of $SiO_2$, $Si_3N_4$, $Al_2O_3$ and AlN disposed on one of the facets of the resonator, and in close contact with the facet of the resonator, the dielectric film having a thickness obtained by dividing by 2 a positive integer multiple of a first in-medium wavelength determined by a first refractive index of the material composing the dielectric film and a wavelength of emitted light of the compound semiconductor laser body; and a first dielectric double layered film on the dielectric film, having a first layer of amorphous silicon and a second layer of a material having a third refractive index lower than a second refractive index of amorphous silicon, the first layer being closer to the dielectric film than the second layer, and having a thickness less than $\frac{1}{4}$ of a second in-medium wavelength determined by the second refractive index and the wavelength of the emitted light, and the second layer having a thickness exceeding $\frac{1}{4}$ of a third in-medium wavelength determined by the third refractive index and the wavelength of the emitted light and less than $\frac{1}{2}$ of the third in-medium wavelength.

Accordingly, in the semiconductor laser according to the present invention, this configuration can reduce the electric field strength of light at the interface between different kinds of materials constituting the second dielectric double layered film and further improve reliability against COD. Moreover, this configuration can provide a semiconductor laser device making deterioration less likely to occur in the vicinity of the interface between the facet of the resonator and reflection film and having a low threshold current and high yield.

According to still further aspect of the present invention, there is provided a semiconductor laser device comprising: a compound semiconductor laser body having an resonator with facets mutually opposed; a dielectric film of any one material of $SiO_2$, $Si_3N_4$, $Al_2O_3$ and AlN disposed on one of the facets of the resonator, and in close contact with the facet of the resonator, the dielectric film having a thickness of $\frac{1}{25}$ or less of a first in-medium wavelength determined by a first refractive index of the material composing the dielectric film and a wavelength of emitted light of the compound semiconductor laser body; and a first dielectric double layered film on the dielectric film, having a first layer of amorphous silicon and a second layer of a material having a third refractive index lower than a second refractive index of amorphous silicon, the first layer being closer to the dielectric film than the second layer, and having a thickness less than $\frac{1}{4}$ of a second in-medium wavelength determined by the second refractive index and the wavelength of the emitted light, and the second layer having a thickness exceeding $\frac{1}{4}$ of a third in-medium wavelength determined by the third refractive index and the wavelength of the emitted light and less than $\frac{1}{2}$ of the third in-medium wavelength.

Accordingly, in the semiconductor laser according to the present invention, this configuration causes the dielectric film to be formed of any one material of $SiO_7$, $Si_3N_4$, $Al_2O_3$ and AlN, and thereby increases the bonding strength at the interface between the facet of the resonator and the dielectric film and at the interface between the dielectric film and a-Si which is the first layer of the first dielectric double layered film, can firmly stack the first dielectric double layered film and form the high reflectance film with high yield. Furthermore, the dielectric film has a thickness $\frac{1}{25}$ or less of the first in-medium wavelength determined by the first refractive index and the wavelength of emitted light of the compound semiconductor laser body, and therefore by causing the electric field strength of light at the interface between the facet of the resonator and the dielectric film to approximate to a minimum value, the present embodiment can suppress light absorption at the interface, improve heat dissipation in the vicinity of this interface and further suppress the occurrence of COD.

Other objects and advantages of the invention will become apparent from the detailed description given hereinafter. It should be understood, however, that the detailed description and specific embodiments are given by way of illustration only since various changes and modifications within the scope of the invention will become apparent to those skilled in the art from this detailed description.

BRIEF DESCRIPTION OF THE DRAWINGS

In all figures, the substantially same elements are given the same reference numbers.

DESCRIPTION OF THE PREFERRED EMBODIMENTS

First Embodiment

In the following explanations, a semiconductor laser will be described by taking a Fabry-Perot semiconductor laser as an example, but similar effects will also be obtained even when the present invention is applied to a distributed feedback semiconductor laser or a distributed reflector semiconductor laser.

Figure 1:
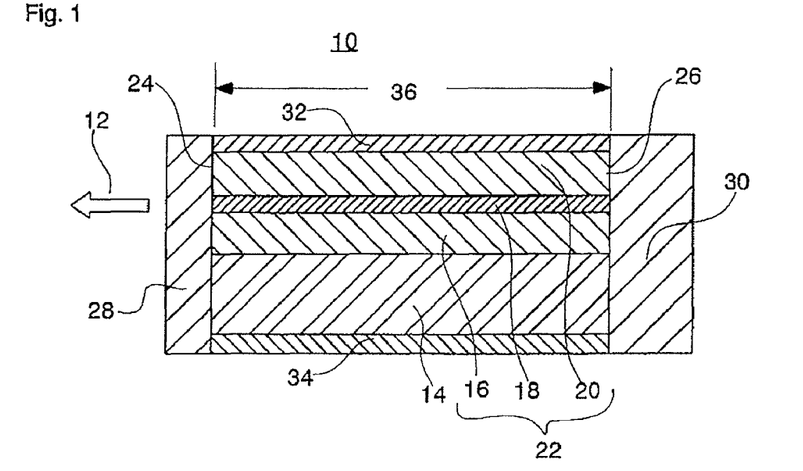
FIG. 1 is a cross-sectional view of a semiconductor laser according to an embodiment of the present invention.

FIG. 1 is a cross-sectional view of a semiconductor laser according to an embodiment of the present invention. In the following drawings, identical reference numerals will denote identical or equivalent components.

The cross-sectional view of the semiconductor laser 10 in FIG. 1 is a cross-sectional view of a cross section parallel to a waveguide direction of the semiconductor laser and the arrow indicates emitted light 12 of the semiconductor laser 10.

The semiconductor laser 10 is a long-wavelength semiconductor laser, an oscillating wavelength of which falls within a range of 1250 nm to 1650 nm.

The semiconductor laser 10 is made up of, for example, an n-type (hereinafter, n-type will be described as "n-," p-type will be described as "p-" and an intrinsic type with no impurity injected in particular will be described as "i-") InP substrate 14, and an n-type clad layer 16 of n-InP, an active layer 18 of InGaAsP and a p-type clad layer 20 of p-InP sequentially stacked on this InP substrate 14, and the n-type clad layer 16, active layer 18 and p-type clad layer 20 form a resonator 22. Furthermore, a p-electrode 32 is disposed on the surface of the p-type clad layer 20 and an n-electrode 34 is disposed on the back of the InP substrate 14.

A semiconductor laser body 36 is made up of the InP substrate 14, resonator 22 disposed on the InP substrate 14, p-electrode 32 and n-electrode 34.

A cleaving surface including the front facet of the resonator 22 on the emitted laser light side is assumed here as a front facet 24 of the semiconductor laser body 36 and a cleaving surface facing the front facet 24 via the semiconductor laser body 36 is assumed here as a rear facet 26 of the semiconductor laser body 36. A front high reflection film 28 is disposed in close contact with the surface of the front facet 24 of the semiconductor laser body 36 and a rear high reflection film 30 is disposed in close contact with the rear facet 26 of the semiconductor laser body 36.

A structure with an n-AlInAs layer interposed between an n-type clad layer of n-InP and an AlGaInAs active layer and a p-AlInAs layer interposed between a p-type clad layer of p-InP and an AlGaInAs active layer is known in the semiconductor laser using, for example, AlGaInAs for the active layer as the structure of the semiconductor laser body 36.

Figure 2:
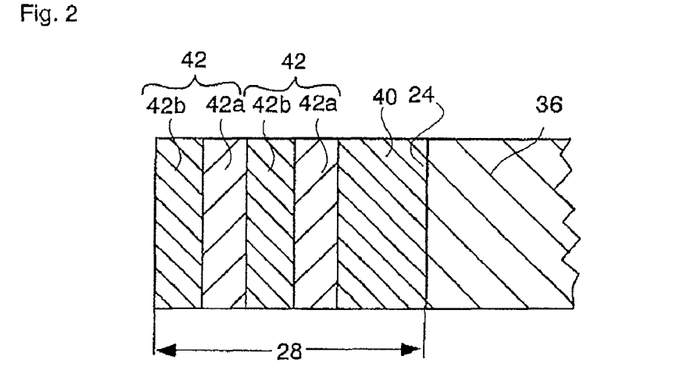
FIG. 2 is a partial cross-sectional view in the vicinity of the front high reflection film of the semiconductor laser according to an embodiment of the present invention.

FIG. 2 is a partial cross-sectional view in the vicinity of the front high reflection film of the semiconductor laser according to an embodiment of the present invention.

When the reflectance is, for example, 60%, the front high reflection film 28 has the following configuration.

An $SiO_2$ film 40 having a film thickness of, for example, $\lambda/2$ is disposed in close contact with the front facet 24 of the semiconductor laser body 36 as a dielectric film.

Here, $\lambda$ is an in-medium wavelength and $\lambda$=(wavelength of light emitted from the semiconductor laser body in vacuum) ÷(refractive index of the medium through which laser light propagates) as defined above and $\lambda$ varies depending on the medium through which laser light propagates. In the following explanations, $\lambda$ will also mean an in-medium wavelength.

Next, two pairs of dielectric double layered films 42 are stacked on this $SiO_2$ film 40 as a first dielectric double layered film.

The dielectric double layered film 42 is made up of an a-Si film 42a having a thickness of $\lambda/4$ as a first layer in close contact with the $SiO_2$ film 40 and an $SiO_2$ film 42b having a thickness of $\lambda/4$ as a second layer superimposed on this a-Si film 42a. When two pairs of dielectric double layered films 42 are superimposed one on another, the two pairs are superimposed so that the dielectric film of the first layer and the dielectric film of the second layer making up the dielectric double layered film 42 are arranged in the same order.

Therefore, the front high reflection film 28 is disposed on the front facet 24 of the semiconductor laser body 36, with the $SiO_2$ film 40 in close contact with the front facet 24 of the semiconductor laser body 36, a-Si film 42a, $SiO_2$ film 42b, a-Si film 42a and $SiO_2$ film 42b superimposed one on another in this order.

Since the refractive index of $SiO_2$ is 1.40 to 1.45, if the oscillating wavelength is assumed to be 1250 nm to 1650 nm, the $SiO_2$ film 40 has a thickness on the order of approximately 420 nm to 600 nm.

On the other hand, since the refractive index of a-Si is 3 to 3.4, the a-Si film 42a has a thickness of approximately 90 nm to 140 nm and the $SiO_2$ film 42b has a thickness on the order of approximately 210 nm to 300 nm.

Furthermore, the length of the resonator 22 varies depending on the use, and is generally on the order of 200 μm to 1500 μm. The refractive index of InP constituting the resonator 22 is on the order of 3.2 and those of both InGaAsP and AlGaInAs are on the order of 3.2 to 3.5. Therefore, the refractive index of the resonator 22 is substantially the same as the refractive index of the a-Si film 42a.

Figure 3:
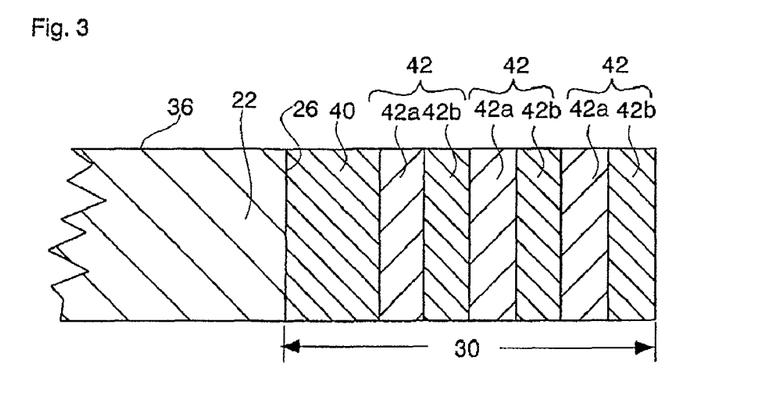
FIG. 3 is a partial cross-sectional view in the vicinity of the rear high reflection film of the semiconductor laser according to an embodiment of the present invention.

FIG. 3 is a partial cross-sectional view in the vicinity of the rear high reflection film of the semiconductor laser according to an embodiment of the present invention.

When a reflectance is, for example, 90%, the rear high reflection film 30 has the following configuration.

An $SiO_2$ film 40 having a layer thickness of, for example, $\lambda/2$ is disposed as a dielectric film in close contact with the rear facet 26 of the semiconductor laser body 36. Next, three pairs of dielectric double layered films 42 are superimposed one on another on this $SiO_2$ film 40.

Therefore, the rear high reflection film 30 is made up of the $SiO_2$ film 40 in close contact with the rear facet 26 of the semiconductor laser body 36, a-Si film 42a, $SiO_2$ film 42b, a-Si film 42a, $SiO_2$ film 42b, a-Si film 42a and $SiO_2$ film 42b superimposed one on another in this order on the rear facet 26 of the semiconductor laser body 36.

In this configuration, the $SiO_2$ film 40 is used as the dielectric film in close contact with the front facet 24 and rear facet 26 of the semiconductor laser body 36. This can be a material that at least displays high adherence to the semiconductor, has proven results and has a smaller refractive index than the next superimposed layer (a-Si film 42a in this example). Therefore, $Al_2O_3$, $Si_3N_4$ or AlN may also be used, for example.

Furthermore, though the $SiO_2$ film 42b is used as the second layer of the dielectric double layered film 42, this layer can also be a material that at least has a lower refractive index than the a-Si film 42a, and therefore an $Al_2O_3$ film may also be used instead of the $SiO_2$ film.

The conventional Fabry-Perot semiconductor laser has a reflectance on the order of 30% when a single-layer $Al_2O_3$ film having a thickness of $\lambda/2$ is formed on the front facet of the resonator and has a reflectance of approximately 60% when three layers of $SiO_2$ film, Si film and $SiO_2$ film each having a layer thickness of $\lambda/4$ are stacked on the rear facet of the resonator.

In this embodiment, since the reflectance of the front high reflection film 28 is 60% and the reflectance of the rear high reflection film 30 is 90%, mirror loss is reduced compared to the conventional Fabry-Perot semiconductor laser and it is possible to obtain a semiconductor laser with a low threshold current.

The reflectance of the rear high reflection film 30 is higher than that of the front high reflection film 28, which is the facet from which laser light emits, and therefore the number of pairs of dielectric double layered films 42 superimposed increases and the total layer thickness of the rear high reflection film 30 increases, but when the total layer thickness exceeds 2 μm, the film is more likely to peel off due to thermal stress during assembly. Therefore, the total layer thickness of the rear high reflection film 30 is preferably 2 μm or less.

As shown in this configuration, the a-Si film 42a is used as the first layer of the dielectric double layered film 42, but since a-Si has a high refractive index, even if the thickness of the rear high reflection film 30 is preferred to be set to 2 μm or less, it is possible to obtain a reflectance of 80% or more with a semiconductor laser in a 1.3 nm band or 1.5 nm band.

Figure 4:
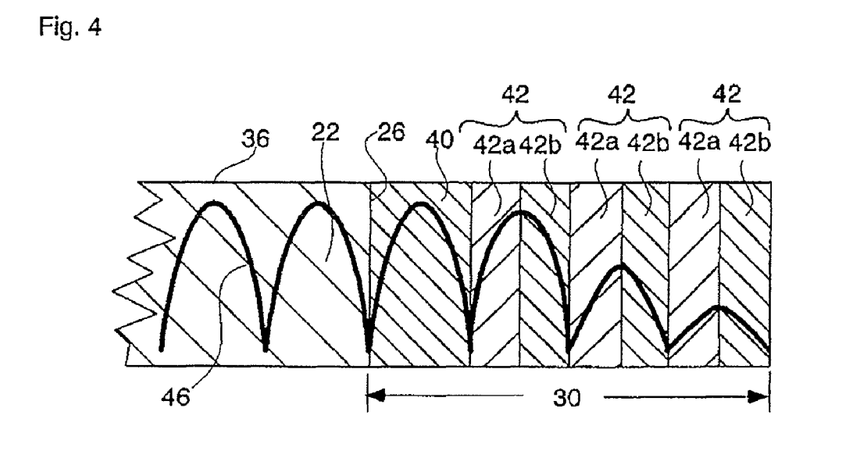
FIG. 4 is a schematic view illustrating electric field strength of light in the high reflection film of the semiconductor laser according to Embodiment 1 of the present invention.

FIG. 4 is a schematic view illustrating electric field strength of light in the high reflection film of the semiconductor laser according to Embodiment 1 of the present invention.

With regard to the high reflection film in FIG. 4, the rear high reflection film 30 is explained as an example, but the same applies to the front high reflection film 28, too.

In FIG. 4, a curve 46 shows a distribution of electric field strength of light. The upward convex portions of the curve 46 show maximum values of the electric field strength of light and the bottom ends show minimum values.

In the distribution of electric field strength of light at and in the vicinity of the rear high reflection film 30, the electric field strength of light shows a minimum value on a boundary between the semiconductor laser body 36 and the $SiO_2$ film 40, also shows a minimum value on a boundary between the $SiO_2$ film 40 and the a-Si film 42a of the dielectric double layered film 42 of the first pair and shows minimum values on a boundary between the dielectric double layered film 42 of the first pair and the dielectric double layered film 42 of the second pair, on a boundary between the dielectric double layered film 42 of the second pair and the dielectric double layered film 42 of the third pair and on the surface of the dielectric double layered film 42 of the third pair exposed to air.

On the other hand, the electric field strength of light shows a maximum value on a boundary between the a-Si film 42a of the first layer and the $SiO_2$ film 42b of the second layer of each dielectric double layered films 42.

With regard to the configurations of the respective layers at and in the vicinity of the rear high reflection film 30 disposed on the rear facet 26 of the semiconductor laser body 36 with respect to a refractive index, the rear high reflection film 30 is made up of the low refractive index film ($SiO_2$ film 40) having a layer thickness of $\lambda/2$ in close contact with the resonator 22 of the semiconductor laser body 36, high refractive index film (a-Si film 42a) having a layer thickness of $\lambda/4$, low refractive index film ($SiO_2$ film 42b) having a layer thickness of $\lambda/4$, high refractive index film (a-Si film 42a) having a layer thickness of $\lambda/4$, low refractive index film ($SiO_2$ film 42b) having a layer thickness of $\lambda/4$, high refractive index film (a-Si film 42a) having a layer thickness of $\lambda/4$ and low refractive index film ($SiO_2$ film 42b) having a layer thickness of $\lambda/4$.

In such a configuration, the electric field strength of light at the interface between the resonator 22 of the semiconductor laser body 36 and the low refractive index film ($SiO_2$ film 40) having a layer thickness of $\lambda/2$ displays a minimum value, showing the distribution of electric field strength of light as shown in FIG. 4.

Light absorption is essentially likely to occur on an interface between different kinds of materials. Light absorption and accompanying heat generation on an interface between different kinds of materials are known to be key factors responsible for deterioration of a semiconductor laser. COD is known widely as one of main factors for such deterioration, which is likely to occur due to light absorption at the interface between the semiconductor material and the first layer of the reflection film.

To suppress light absorption on an interface between different kinds of materials, reducing a photon density at that location is effective. This is because when a photon density is low, light absorption is less likely to occur. The photon density is determined by electric field strength of light and the photon density is large in an area where electric field strength of light is high. Therefore, reducing electric field strength of light on an interface between different kinds of materials is effective in suppressing deterioration of a semiconductor laser.

Therefore, the configuration of the rear high reflection film 30 according to this Embodiment 1 includes the $SiO_2$ film 40 in close contact with the rear facet 26 of the semiconductor laser body 36, a-Si film 42a, $SiO_2$ film 42b, a-Si film 42a, $SiO_2$ film 42b, a-Si film 42a and $SiO_2$ film 42b on the rear facet 26 of the semiconductor laser body 36, constitutes a high reflection film with a high reflectance, reduces mirror loss, reduces a threshold current of the semiconductor laser, and further reduces to a minimum the electric field strength of light at the interface between the resonator 22 of the semiconductor laser body 36 and the low refractive index film ($SiO_2$ film 40) having a layer thickness of $\lambda/2$, thereby reduces a photon density on this interface, reduces light absorption and accompanying heat generation, and can thereby suppress the occurrence of COD at the interface between the facet of the resonator 22 of the semiconductor laser body 36 and the $SiO_2$ film 40. That is, it is possible to simultaneously achieve the reduction of a threshold current and suppression of the occurrence of COD.

Moreover, this configuration provides high adherence between the semiconductor material making up the resonator 22 of the semiconductor laser body 36 and the $SiO_2$ film 40 and high mechanical strength. Likewise, this configuration also provides high adherence at the interface between the $SiO_2$ film 40 and the a-Si film 42a and high mechanical strength. Therefore, the rear high reflection film 30 can be firmly stacked on the rear facet 26 of the semiconductor laser body 36. Thus, even when many dielectric double layered films 42 constituting the rear high reflection film 30 are stacked, it is possible to suppress peeling of the rear high reflection film 30 from the rear facet 26 of the semiconductor laser body 36 due to heating during assembly and increase the yield of the product.

A case has been explained so far where a Fabry-Perot semiconductor laser is taken as an example, but it is possible to obtain effects similar to those of the semiconductor laser 10, which is a Fabry-Perot semiconductor laser, by using a film of material having a refractive index approximate to the square root of the refractive index of the material making up, for example, the resonator on the facet side from which laser light emits, for example, an $Si_3N_4$ film having a layer thickness of $\lambda/4$ as an antireflection film and forming a reflection film similar to the rear high reflection film 30 on the rear facet.

Especially a distributed feedback semiconductor laser has an increased light density on the rear high reflection film side, but can reduce electric field strength of light at the interface between the resonator and the rear high reflection film, and can thereby suppress deterioration of the laser. Furthermore, the distributed feedback semiconductor laser can prevent the rear high reflection film from peeling from the facet of the semiconductor laser body.

On the other hand, a distributed reflector semiconductor laser has a configuration in which a passive waveguide is connected on the light-emerging facet side of the active layer contiguous to the active layer disposed on the rear facet side of the resonator and a diffraction grating is formed along this passive waveguide, but by forming an antireflection film on the light-emerging facet on the passive waveguide side and forming a reflection film similar to the rear high reflection film 30 of Embodiment 1 on the rear facet side, it is possible to obtain effects similar to those of the semiconductor laser 10, which is a Fabry-Perot semiconductor laser.

As described above, the semiconductor laser device according to the present invention includes a compound semiconductor laser body having an resonator with facets mutually opposed; a dielectric film of any one material of $SiO_2$, $Si_3N_4$, $Al_2O_3$ and AlN disposed on one of the facets of the resonator, and in close contact with the facet of the resonator, the dielectric film having a thickness obtained by dividing by 2 a positive integer multiple of a first in-medium wavelength determined by a first refractive index of the material composing the dielectric film and a wavelength of emitted light of the compound semiconductor laser body; and a first dielectric double layered film on the dielectric film, having a first layer of amorphous silicon and a second layer of a material having a third refractive index lower than a second refractive index of amorphous silicon, the first layer being closer to the dielectric film than the second layer, and having a thickness ¼ of a second in-medium wavelength determined by the second refractive index and the wavelength of the emitted light, and the second layer having a thickness ¼ of a third in-medium wavelength determined by the third refractive index and the wavelength of the emitted light.

In this configuration, the dielectric film is formed of any one material of $SiO_2$, $Si_3N_4$, $Al_2O_3$ and AlN, and therefore bonding strength is high at the interface between the facet of the resonator and dielectric film and the interface between the dielectric film and a-Si which is the first layer of the first dielectric double layered film, and it is thereby possible to firmly stack the first dielectric double layered film and form a high reflectance film with high yield. Furthermore, the electric field strength of light at the interface between the facet of the resonator and the dielectric film and at the interface between the dielectric film and a-Si which is the first layer of the first dielectric double layered film displays a minimum value, light absorption at these interfaces is suppressed and the occurrence of COD (Catastrophic Optical Damage) can be suppressed. Moreover, it is possible to provide a semiconductor laser device having a low threshold current, making deterioration less likely to occur in the vicinity of the interface between the facet of the resonator and the reflection film and providing high reliability and high yield.

Second Embodiment

Figure 5:
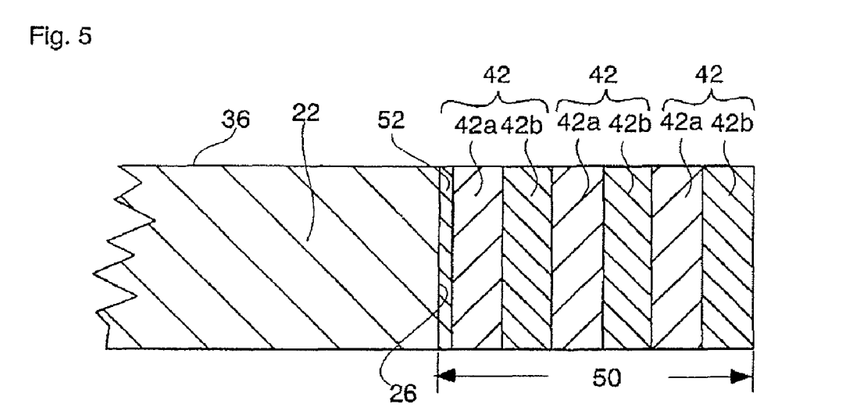
FIG. 5 is a partial cross-sectional view in the vicinity of a rear high reflection film of a semiconductor laser according to an embodiment of the present invention.

FIG. 5 is a partial cross-sectional view in the vicinity of a rear high reflection film of a semiconductor laser according to an embodiment of the present invention.

This Embodiment 2 will be explained taking a case where the present invention is applied to a rear high reflection film, but similar effects will be obtained also in a case where the present invention is applied to a front high reflection film.

In FIG. 5, a rear reflection film 50 has three pairs of dielectric double layered films 42 stacked one on another as in the case of the rear reflection film 30 of Embodiment 1, but while in the rear reflection film 30, the $SiO_2$ film 40 having a layer thickness of $\lambda/2$ is disposed in close contact with the rear facet 26 of the semiconductor laser body 36 and three pairs of dielectric double layered films 42 are superimposed thereon, in the rear reflection film 50, a thin film of $SiO_2$, for example, an $SiO_2$ film 52 having a layer thickness of $\lambda/25$ is disposed as a dielectric film in close contact with the rear facet 26 of the semiconductor laser body 36 and three pairs of dielectric double layered films 42 are superimposed thereon.

That is, when the rear high reflection film 50 has a reflectance of, for example, 90%, the following configuration is adopted.

The $SiO_2$ film 52 having a layer thickness of $\lambda/25$ is disposed in close contact with the rear facet 26 of the semiconductor laser body 36. Next, three pairs of dielectric double layered films 42 are superimposed on this $SiO_2$ film 52.

Therefore, the rear high reflection film 50 is made up of the low refractive index film ($SiO_2$ film 52) having a layer thickness of $\lambda/25$ in close contact with the rear facet 26 of the semiconductor laser body 36, high refractive index film (a-Si film 42a) having a layer thickness of $\lambda/4$, low refractive index film ($SiO_2$ film 42b) having a layer thickness of $\lambda/4$, high refractive index film (a-Si film 42a) having a layer thickness of $\lambda/4$, low refractive index film ($SiO_2$ film 42b) having a layer thickness of $\lambda/4$, high refractive index film (a-Si film 42a) having a layer thickness of $\lambda/4$ and low refractive index film ($SiO_2$ film 42b) having a layer thickness of $\lambda/4$ on the rear facet 26 of the semiconductor laser body 36.

In this configuration, the $SiO_2$ film 52 is used as the dielectric film in close contact with the rear facet 26 of the semiconductor laser body 36. $Si_3N_4$, $Al_2O_3$ or AlN, for example, may also be used as in the case of Embodiment 1.

In the configuration of this Embodiment 2, the semiconductor laser body 36 and the a-Si film 42a have substantially the same order of refractive index and even when the thin $SiO_2$ film 52 is interposed between the semiconductor laser body 36 and a-Si film 42a, the distribution of electric field strength of light is determined by the specifications of the semiconductor laser body 36 and a-Si film 42a.

Figure 6:
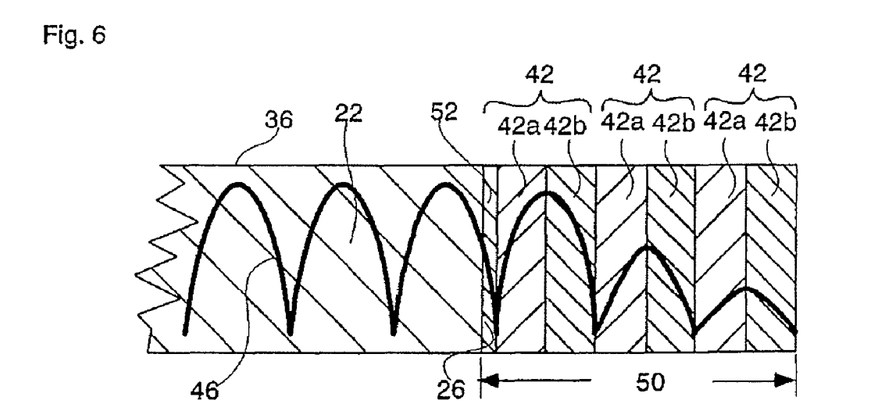
FIG. 6 is a schematic view illustrating electric field strength of light in the high reflection film of the semiconductor laser according to Embodiment 2 of the present invention.

FIG. 6 is a schematic view illustrating electric field strength of light in the high reflection film of the semiconductor laser according to Embodiment 2 of the present invention.

In FIG. 6, the distribution of electric field strength of light in the vicinity of the rear high reflection film 50 is shown by a curve 46 and the electric field strength of light of the rear high reflection film 50 does not display a minimum value at the interface between the semiconductor laser body 36 and the $SiO_2$ film 52, but displays a minimum value on the boundary between the $SiO_2$ film 52 and the a-Si film 42a of the dielectric double layered film 42 of the first pair and displays a minimum value on the boundary between the dielectric double layered film 42 of the first pair and the dielectric double layered film 42 of the second pair, on the boundary between the dielectric double layered film 42 of the second pair and the dielectric double layered film 42 of the third pair and on the surface of the dielectric double layered film 42 of the third pair exposed to air. On the other hand, the electric field strength of light displays a maximum value on the boundary between the a-Si film 42a of the first layer and the $SiO_2$ film 42b of the second layer of each dielectric double layered film 42.

Though the electric field strength of light at the interface between the resonator 22 of the semiconductor laser body 36 and low refractive index film ($SiO_2$ film 52) having a thickness of $\lambda/25$ is not a minimum value, but since the thickness of the $SiO_2$ film 52 is small, this shows a value approximate to a minimum value on the boundary between the $SiO_2$ film 52 and a-Si film 42a of the dielectric double layered film 42 of the first pair.

Figure 7:
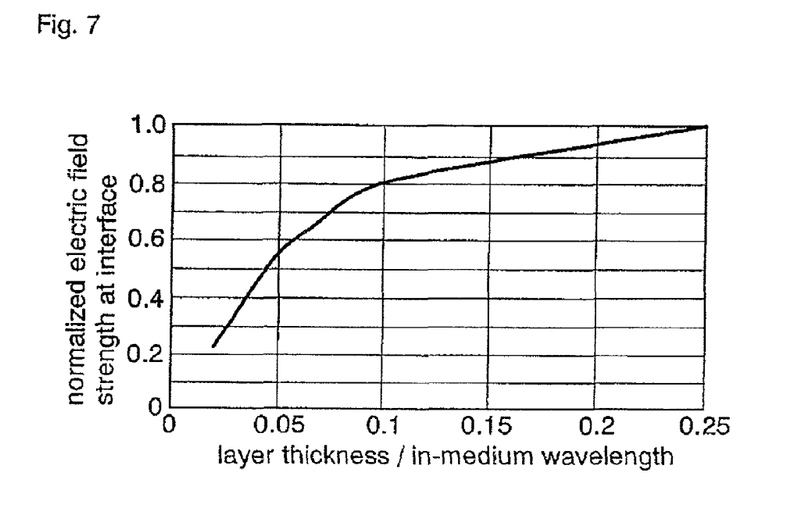
FIG. 7 is a graph showing electric field strength at the interface with respect to a thickness of the dielectric film according to the present invention.

FIG. 7 is a graph showing electric field strength at the interface with respect to a thickness of the dielectric film according to the present invention.

In FIG. 7, the horizontal axis shows a ratio of a layer thickness to an in-medium wavelength, that is, layer thickness/in-medium wavelength, and the vertical axis shows normalized electric field strength at the interface. When the horizontal axis is 0.25, that is, when the layer thickness is $\lambda/4$, electric field strength normalized at the interface is assumed to be 1.

That is, explaining the present embodiment using FIG. 5 and FIG. 6, it is shown that the electric field strength of light at the interface between the resonator 22 of the semiconductor laser body 36 and the $SiO_2$ film 52 is 1, which is a maximum value, when the film thickness of the $SiO_2$ film 52 is $\lambda/4$.

In the case of Embodiment 1, the $SiO_2$ film 40 having a thickness of $\lambda/2$ is disposed on the facet of the resonator 22 of the semiconductor laser body 36, but while a-Si has a high coefficient of thermal conductivity, $SiO_2$ has a low coefficient of thermal conductivity and there may be cases where heat dissipation of heat generated at the interface between the resonator 22 and the rear high reflection film 30 is not realized successfully. In such a case, the thickness of the $SiO_2$ film may be reduced to improve thermal conductivity.

Based on this concept, Embodiment 2 disposes the $SiO_9$ film 52 having a reduced thickness.

As described above, the electric field strength of light does not become a minimum value at the interface between the resonator 22 of the semiconductor laser body 36 and the $SiO_2$ film 52 and the normalized electric field strength at the interface shown in FIG. 7 above is maintained with the thickness of the $SiO_2$ film 52. Therefore, an upper limit value of the thickness of the $SiO_2$ film 52 is determined by the extent to which the electric field strength of light is tolerable.

In the present embodiment, the layer thickness is assumed to be, for example, $\lambda/25$ for the following reason.

In the case of a conventional Fabry-Perot semiconductor laser, the light density on the rear facet of the semiconductor laser shown in Embodiment 1 assumed to have a reflectance of the front facet of 60% and a reflectance of the rear facet of 90% is two times higher than that of a semiconductor laser assumed to have a reflectance of the front facet of 30% and a reflectance of the rear facet of 60%. Therefore, when the electric field strength of light is reduced to ½ of that of the conventional semiconductor laser, equivalent reliability can be secured.

With reference to FIG. 7, the film thickness when the normalized electric field strength at the interface becomes ½ corresponds to a location where the value of layer thickness/in-medium wavelength is roughly 0.04 and this namely shows that the layer thickness is $\lambda/25$.

In this Embodiment 2, the thickness of the $SiO_2$ film 52 is assumed to be, for example, $\lambda/25$, and by setting the film thickness of the $SiO_2$ film 52 to $\lambda/25$ or less, it is possible to further improve heat dissipation of heat generated at the interface between the resonator 22 and the rear high reflection film 30 and reduce electric field strength of light at the interface between the resonator 22 and the $SiO_2$ film 52. Moreover, a semiconductor laser with higher reliability against COD can be configured.

Therefore, the configuration of the rear high reflection film 50 according to Embodiment 2 includes the $SiO_2$ film 52 in close contact with the rear facet 26 of the semiconductor laser body 36, a-Si film 42a, $SiO_2$ film 42b, a-Si film 42a, $SiO_2$ film 42b, a-Si film 42a and $SiO_2$ film 42b superimposed one on another in this order on the rear facet 26 of the semiconductor laser body 36, and it is thereby possible to constitute a high reflection film with a high reflectance and reduce a threshold current of the semiconductor laser with reduced mirror loss. Furthermore, by causing the electric field strength of light at the interface between the resonator 22 of the semiconductor laser body 36 and the thin low refractive index film ($SiO_2$ film 52) to approximate to a minimum value as much as possible, it is possible to reduce light absorption and accompanying heat generation, further improve heat dissipation in the vicinity of the interface between the facet of the resonator 22 of the semiconductor laser body 36 and the $SiO_2$ film 52 and improve reliability against COD.

As described above, the semiconductor laser device according to the present invention includes a compound semiconductor laser body having an resonator with facets mutually opposed; a dielectric film of any one material of $SiO_9$, $Si_3N_4$ and AlN disposed on one of the facets of the resonator, and in close contact with the facet of the resonator, the dielectric film having a thickness ¹⁄₂₅ or less of a first in-medium wavelength determined by a first refractive index of the material composing the dielectric film and a wavelength of emitted light of the compound semiconductor laser body; and a first dielectric double layered film on the dielectric film, having a first layer of amorphous silicon and a second layer of a material having a third refractive index lower than a second refractive index of amorphous silicon, the first layer being closer to the dielectric film than the second layer, and having a thickness ¼ of a second in-medium wavelength determined by the second refractive index and the wavelength of the emitted light, and the second layer having a thickness ¼ of a third in-medium wavelength determined by the third refractive index and the wavelength of the emitted light.

In this configuration, the dielectric film is formed of any one material of $SiO_2$, $Si_3N_4$ and AlN, and therefore bonding strength is high at the interface between the facet of the resonator and dielectric film and the interface between the dielectric film and a-Si which is the first layer of the first dielectric double layered film, and it is thereby possible to firmly stack the first dielectric double layered film and form a high reflectance film with high yield. Furthermore, since the dielectric film has a thickness ⅕ or less of the first in-medium wavelength determined by the first refractive index and the wavelength of emitted light of the compound semiconductor laser body, by causing electric field strength of light at the interface between the facet of the resonator and the dielectric film to approximate to a minimum value, it is possible to suppress light absorption at this interface, improve heat dissipation in the vicinity of this interface and further suppress the occurrence of COD. Moreover, it is possible to provide a semiconductor laser device having a low threshold current, making deterioration less likely to occur in the vicinity of the interface between the facet of the resonator and the reflection film and providing high reliability and high yield.

Third Embodiment

Figure 8:
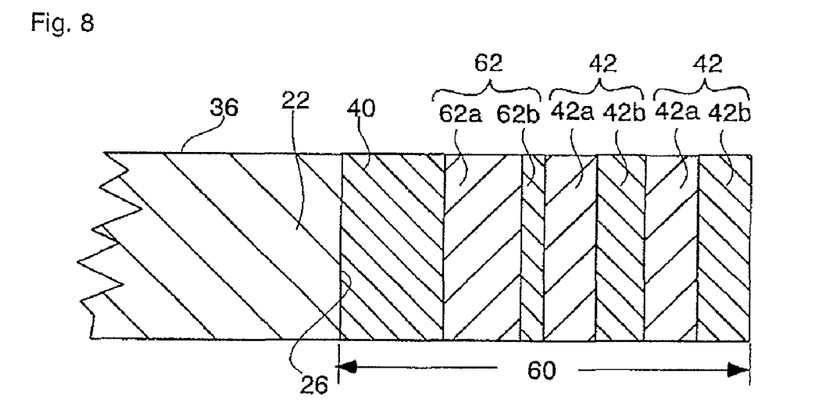
FIG. 8 is a partial cross-sectional view in the vicinity of a rear high reflection film of a semiconductor laser according to an embodiment of the present invention.

FIG. 8 is a partial cross-sectional view in the vicinity of a rear high reflection film of a semiconductor laser according to an embodiment of the present invention.

This Embodiment 3 will be explained taking a case where the present invention is applied to a rear high reflection film, but similar effects will be obtained also in a case where the present invention is applied to a front high reflection film.

In FIG. 8, a rear reflection film 60 includes an $SiO_2$ film 40 having a layer thickness of, for example, $\lambda/2$ as a dielectric film in close contact with the rear facet 26 of the semiconductor laser body 36. Next, one pair of dielectric double layered film 62 is disposed as a second dielectric double layered film on this $SiO_2$ film 40 and two pairs of dielectric double layered films 42 are superimposed on this dielectric double layered film 62.

The dielectric double layered film 62 is made up of an a-Si film 62a of a first layer having a layer thickness of, for example, $3\lambda/8$ in close contact with the $SiO_2$ film 40 and an $SiO_2$ film 62b of a second layer having a layer thickness of $\lambda/8$ superimposed on this a-Si film 62a.

That is, the rear high reflection film 60 has the following configuration and the reflectance changes from 90% to a certain extent.

The rear high reflection film 60 is made up of the low refractive index film ($SiO_2$ film 40) having a layer thickness of $\lambda/2$ in close contact with the resonator 22 of the semiconductor laser body 36, high refractive index film (a-Si film 62a) having a layer thickness of $3\lambda/8$, low refractive index film ($SiO_2$ film 62b) having a layer thickness of $\lambda/8$, high refractive index film (a-Si film 42a) having a layer thickness of $\lambda/4$, low refractive index film ($SiO_2$ film 42b) having a layer thickness of $\lambda/4$, high refractive index film (a-Si film 42a) having a layer thickness of $\lambda/4$ and low refractive index film ($SiO_2$ film 42b) having a layer thickness of $\lambda/4$.

Figure 9:
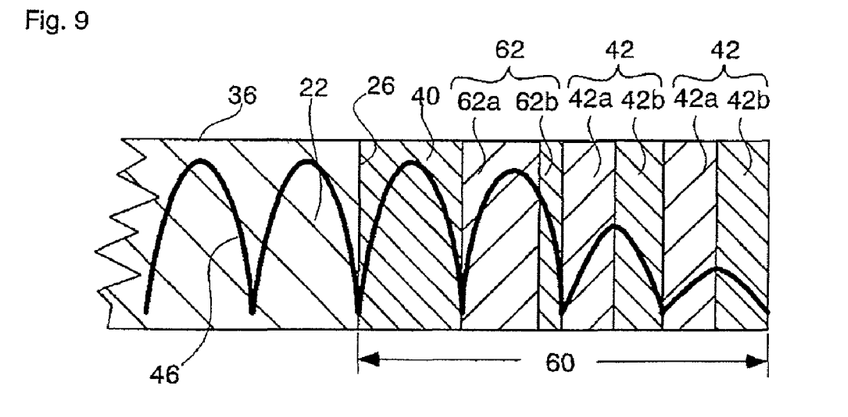
FIG. 9 is a schematic view illustrating the electric field strength of light in a high reflection film of the semiconductor laser according to Embodiment 3 of the present invention.

FIG. 9 is a schematic view illustrating the electric field strength of light in a high reflection film of the semiconductor laser according to Embodiment 3 of the present invention.

In FIG. 9, the distribution of the electric field strength of light at and in the vicinity of the rear high reflection film 60 is shown by a curve 46.

In the distribution of the electric field strength of light at and in the vicinity of the rear high reflection film 60, the electric field strength of light displays a minimum value on the boundary between the semiconductor laser body 36 and the $SiO_2$ film 40, also displays a minimum value on the boundary between the $SiO_2$ film 40 and a-Si film 62a of the dielectric double layered film 62 of the first pair and displays minimum values on the boundary between the dielectric double layered film 62 of the first pair and the dielectric double layered film 42 of the second pair, on the boundary between the dielectric double layered film 42 of the second pair and the dielectric double layered film 42 of the third pair and on the surface of the dielectric double layered film 42 of the third pair exposed to air. This is the same as that of the rear high reflection film 30 of Embodiment 1.

Furthermore, the electric field strength of light displays a maximum value on the boundary between the a-Si film 42a of the first layer and the $SiO_2$ film 42b of the second layer of each dielectric double layered film 42. This is the same as that of the rear high reflection film 30 of Embodiment 1.

However, the electric field strength of light at the interface between the a-Si film 62a and the $SiO_2$ film 62b of the dielectric double layered film 62 of the first pair is not a maximum value and is lower than the maximum value.

As described in the explanations of Embodiment 1, in order to suppress COD, reducing the electric field strength of light at the interface between different kinds of materials is effective. Especially in the configurations shown in Embodiments 1 and 2, when the electric field strength of light on the boundary between the semiconductor material making up the resonator 22 of the semiconductor laser body 36 and the rear or front high reflection film is reduced, the interface between different kinds of materials where the electric field strength of light is next highest is the interface between the first layer and the second layer of the dielectric double layered film of the first pair and is the interface between the a-Si film 42a and the $SiO_2$ film 42b of the dielectric double layered film 42 of the first pair in the case of the rear high reflection film 30 of Embodiment 1.

In order to reduce the electric field strength of light at this interface, Embodiment 3 adopts the high refractive index film (a-Si film 62a) having a layer thickness of $3\lambda/8$ as the first layer in the dielectric double layered film 62 and the low refractive index film ($SiO_2$ film 62b) having a layer thickness of $\lambda/8$ as the second layer to prevent these interfaces from coinciding with the position of the maximum value of the electric field strength of light.

Here, the layer thickness of the first layer is assumed to be $3\lambda/8$ and the layer thickness of the second layer is assumed to be $\lambda/8$, but the present invention is not limited to this and the first layer may have a thickness exceeding $\lambda/4$ and less than $\lambda/2$ and the second layer may have a thickness less than $\lambda/4$.

Furthermore, the present embodiment assumes that the layer thickness of the first layer is larger and the layer thickness of the second layer is smaller, but the present invention is not limited to this and the layer thickness of the first layer may be smaller and the layer thickness of the second layer may be larger.

That is, similar effects can be obtained also in a configuration in which the first layer has a thickness less than $\lambda/4$ and the second layer has a thickness exceeding $\lambda/4$ and less than $\lambda/2$.

Furthermore, by causing the thicknesses of the first layer and second layer of the dielectric double layered film 62 to change, it is possible to select a reflectance as the entire high reflection film relatively freely and increase the degree of freedom of design of a high reflection film.

As described above, the semiconductor laser device according to the present invention includes a compound semiconductor laser body having an resonator with facets mutually opposed; a dielectric film of any one material of $SiO_2$, $Si_3N_9$, $Al_2O_3$ and AlN disposed on one of the facets of the resonator, and in close contact with the facet of the resonator, the dielectric film having a thickness obtained by dividing by 2 a positive integer multiple of a first in-medium wavelength determined by a first refractive index of the material composing the dielectric film and a wavelength of emitted light of the compound semiconductor laser body; and a first dielectric double layered film on the dielectric film, having a first layer of amorphous silicon and a second layer of a material having a third refractive index lower than a second refractive index of amorphous silicon, the first layer being closer to the dielectric film than the second layer, and having a thickness exceeding ¼ of a second in-medium wavelength determined by the second refractive index and the wavelength of the emitted light and less than ½ of the second in-medium wavelength, and the second layer having a thickness less than ¼ of a third in-medium wavelength determined by the third refractive index and the wavelength of the emitted light.

Furthermore, the semiconductor laser device according to the present invention includes a compound semiconductor laser body having an resonator with facets mutually opposed; a dielectric film of any one material of $SiO_2$, $Si_3N_4$, $Al_2O_3$ and AlN disposed on one of the facets of the resonator, and in close contact with the facet of the resonator, the dielectric film having a thickness obtained by dividing by 2 a positive integer multiple of a first in-medium wavelength determined by a first refractive index of the material composing the dielectric film and a wavelength of emitted light of the compound semiconductor laser body; and a first dielectric double layered film on the dielectric film, having a first layer of amorphous silicon and a second layer of a material having a third refractive index lower than a second refractive index of amorphous silicon, the first layer being closer to the dielectric film than the second layer, and having a thickness less than ¼ of a second in-medium wavelength determined by the second refractive index and the wavelength of the emitted light, and the second layer having a thickness exceeding ¼ of a third in-medium wavelength determined by the third refractive index and the wavelength of the emitted light and less than ½ of the third in-medium wavelength.

In addition to the effects of Embodiment 1, this configuration can reduce the electric field strength of light at the interface between different kinds of materials constituting the second dielectric double layered film and further improve reliability against COD. Moreover, this configuration can provide a semiconductor laser device making deterioration less likely to occur in the vicinity of the interface between the facet of the resonator and reflection film and having a low threshold current and high yield.

Fourth Embodiment

Figure 10:
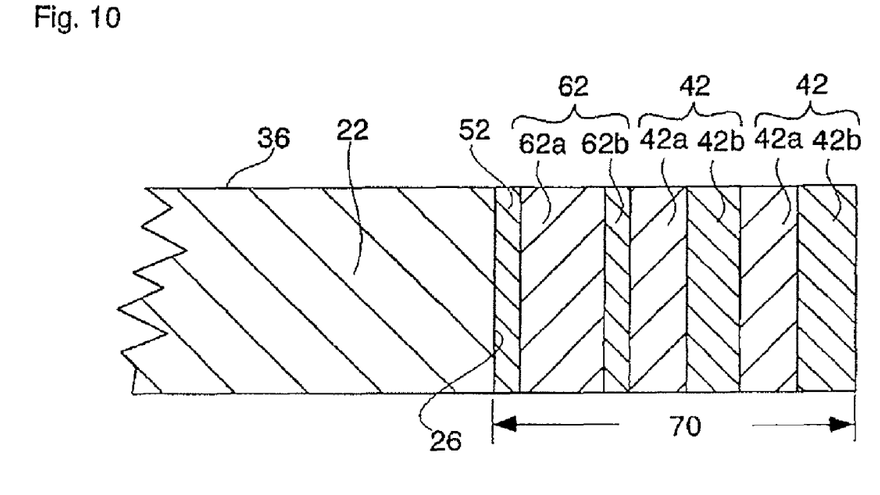
FIG. 10 is a partial cross-sectional view in the vicinity of a rear high reflection film of a semiconductor laser according to an embodiment of the present invention.

FIG. 10 is a partial cross-sectional view in the vicinity of a rear high reflection film of a semiconductor laser according to an embodiment of the present invention.

This Embodiment 4 will be explained taking a case where the present invention is applied to a rear high reflection film, but similar effects will be obtained also in a case where the present invention is applied to a front high reflection film.

In FIG. 10, a rear reflection film 70 is provided with an $SiO_2$ film 52 having a layer thickness of, for example, $\lambda/25$ as a dielectric film in close contact with the rear facet 26 of the semiconductor laser body 36. Next, one pair of dielectric double layered film 62 is superimposed on this $SiO_2$ film 52 and two pairs of dielectric double layered films 42 are superimposed on this dielectric double layered film 62.

That is, the rear high reflection film 70 has the following configuration and the reflectance thereof changes from 90% to a certain extent.

The rear high reflection film 70 is made up of the low refractive index film ($SiO_2$ film 52) having a layer thickness of $\lambda/25$ in close contact with the resonator 22 of the semiconductor laser body 36, high refractive index film (a-Si film 62a) having a layer thickness of $3\lambda/8$, low refractive index film ($SiO_2$ film 62b) having a layer thickness of $\lambda/8$, high refractive index film (a-Si film 42a) having a layer thickness of $\lambda/4$, low refractive index film ($SiO_2$ film 42b) having a layer thickness of $\lambda/4$, high refractive index film (a-Si film 42a) having a layer thickness of $\lambda/4$ and low refractive index film ($SiO_2$ film 42b) having a layer thickness of $\lambda/4$.

Figure 11:
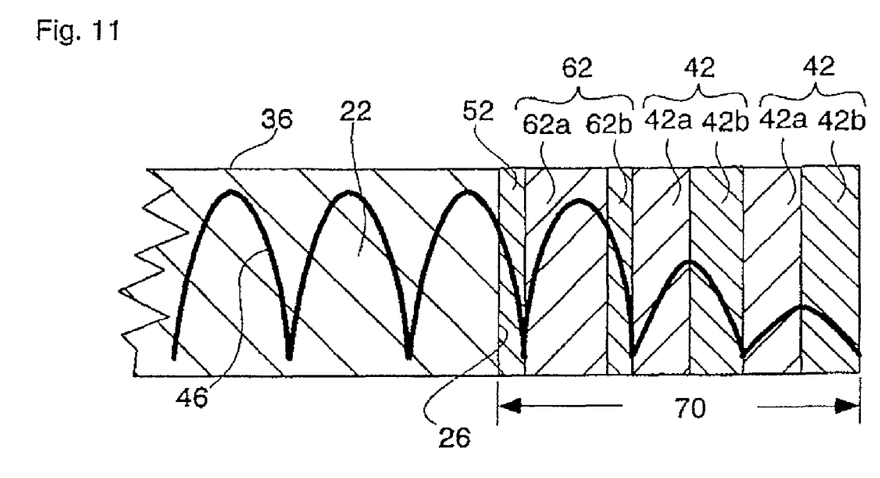
FIG. 11 is a schematic view illustrating the electric field strength of light in the high reflection film of the semiconductor laser according to Embodiment 4 of the present invention.

FIG. 11 is a schematic view illustrating the electric field strength of light in the high reflection film of the semiconductor laser according to Embodiment 4 of the present invention.

In FIG. 11, the distribution of the electric field strength of light at and in the vicinity of the rear high reflection film 70 is shown by a curve 46.

In the distribution of the electric field strength of light at and in the vicinity of the rear high reflection film 70, the electric field strength of light does not display a minimum value at the interface between the semiconductor laser body 36 and the $SiO_2$ film 52, displays a minimum value on the boundary between the $SiO_2$ film 52 and a-Si film 62a of the dielectric double layered film 62 of the first pair and displays minimum values on the boundary between the dielectric double layered film 62 of the first pair and the dielectric double layered film 42 of the second pair, the boundary between the dielectric double layered film 42 of the second pair and the dielectric double layered film 42 of the third pair and the surface of the dielectric double layered film 42 of the third pair exposed to air.

Furthermore, the electric field strength of light displays maximum values on the boundary between the a-Si film 42a of the first layer and the $SiO_2$ film 42b of the second layer of the dielectric double layered film 42 of the second pair and third pair, but the electric field strength of light at the interface between the a-Si film 62a and the $SiO_2$ film 62b of the dielectric double layered film 62 of the first pair is not a maximum value but is lower than the maximum value.

The $SiO_2$ film 52 in close contact with the facet 26 of the resonator 22 of the semiconductor laser body 36 has a smaller coefficient of thermal conductivity than that of a-Si, and therefore the thinner the film, the better the heat dissipation thereof. The layer thickness of the $SiO_2$ film 52 is preferably set to $\lambda/25$ or less as described in Embodiment 2.

This configuration has the effects described in Embodiment 2.

Furthermore, the electric field strength of light at the interface between the a-Si film 62a and $SiO_2$ film 62b of the dielectric double layered film 62 of the first pair is not a maximum value but lower than the maximum value. When the electric field strength of light on the boundary between the semiconductor material making up the resonator 22 of the semiconductor laser body 36 and the rear or front high reflection film is reduced, the interface between different kinds of materials where the electric field strength of light is the next highest is the interface between the first layer and second layer of the dielectric double layered film of the first pair and Embodiment 3 adopts the high refractive index film (a-Si film 62a) having a layer thickness of $3\lambda/8$ for the first layer and the low refractive index film ($SiO_2$ film 62b) having a layer thickness of λ/8 for the second layer of the dielectric double layered film 62 to reduce the electric field strength of light at this interface, and thereby prevents these interfaces from coinciding with the positions of the maximum values of the electric field strength of light.

The thickness of the a-Si film 62a and SiO$_2$ film 62b of the dielectric double layered film 62 of the first pair is determined as described in Embodiment 3.

Therefore, the invention according to Embodiment 4 also has the effects of Embodiment 3 in addition to the effects of Embodiment 2.

As described above, the semiconductor laser device according to the present invention includes a compound semiconductor laser body having an resonator with facets mutually opposed; a dielectric film of any one material of SiO$_2$, Si$_3$N$_4$, Al$_2$O$_3$ and AlN disposed on one of the facets of the resonator, and in close contact with the facet of the resonator, the dielectric film having a thickness of 1/25 or less of a first in-medium wavelength determined by a first refractive index of the material composing the dielectric film and a wavelength of emitted light of the compound semiconductor laser body; and a first dielectric double layered film on the dielectric film, having a first layer of amorphous silicon and a second layer of a material having a third refractive index lower than a second refractive index of amorphous silicon, the first layer being closer to the dielectric film than the second layer, and having a thickness exceeding 1/4 of a second in-medium wavelength determined by the second refractive index and the wavelength of the emitted light and less than 1/2 of the second in-medium wavelength, and the second layer having a thickness less than 1/4 of a third in-medium wavelength determined by the third refractive index and the wavelength of the emitted light.

Furthermore, the semiconductor laser device according to the present invention includes a compound semiconductor laser body having an resonator with facets mutually opposed; a dielectric film of any one material of SiO$_2$, Si$_3$N$_4$, Al$_2$O$_3$ and AlN disposed on one of the facets of the resonator, and in close contact with the facet of the resonator, the dielectric film having a thickness of 1/25 or less of a first in-medium wavelength determined by a first refractive index of the material composing the dielectric film and a wavelength of emitted light of the compound semiconductor laser body; and a first dielectric double layered film on the dielectric film, having a first layer of amorphous silicon and a second layer of a material having a third refractive index lower than a second refractive index of amorphous silicon, the first layer being closer to the dielectric film than the second layer, and having a thickness less than 1/4 of a second in-medium wavelength determined by the second refractive index and the wavelength of the emitted light, and the second layer having a thickness exceeding 1/4 of a third in-medium wavelength determined by the third refractive index and the wavelength of the emitted light and less than 1/2 of the third in-medium wavelength.

This configuration causes the dielectric film to be formed of any one material of SiO$_2$, Si$_3$N$_4$, Al$_2$O$_3$ and AlN, and thereby increases the bonding strength at the interface between the facet of the resonator and the dielectric film and at the interface between the dielectric film and a-Si which is the first layer of the first dielectric double layered film, can firmly stack the first dielectric double layered film and form the high reflectance film with high yield. Furthermore, the dielectric film has a thickness 1/25 or less of the first in-medium wavelength determined by the first refractive index and the wavelength of emitted light of the compound semiconductor laser body, and therefore by causing the electric field strength of light at the interface between the facet of the resonator and the dielectric film to approximate to a minimum value, the present embodiment can suppress light absorption at the interface, improve heat dissipation in the vicinity of this interface and further suppress the occurrence of COD.

Furthermore, the present embodiment can reduce the electric field strength of light at the interface between different kinds of materials making up the second dielectric double layered film and further improve reliability against COD. Moreover, it is possible to provide a semiconductor laser device having a low threshold current, making deterioration less likely to occur in the vicinity of the interface between the facet of the resonator and the reflection film and provide high reliability and high yield.

The above described embodiments allow COD to be suppressed, thereby improve durability, reduce a threshold current leading to a reduction of energy consumption, improve yield and provide the effects of reducing environment loads or the like.

As described above, the semiconductor laser device according to the present invention is suitable for use in an optical communication system or the like.

While the presently preferred embodiments of the present invention have been shown and described. It is to be understood these disclosures are for the purpose of illustration and that various changes and modifications may be made without departing from the scope of the invention as set forth in the appended claims.

What is claimed is:

1. A semiconductor laser device comprising:
    a compound semiconductor laser body having a resonator with facets mutually opposed;
    a dielectric film, selected from the group consisting of SiO$_2$, Si$_3$N$_4$, and AlN, disposed on one of the facets of the resonator, and in contact with the facet of the resonator, the dielectric film having a thickness 1/25 or less of a first in-medium wavelength determined by a first refractive index, which is the refractive index of the material composing the dielectric film, and wavelength of emitted light of the compound semiconductor laser body; and
    a first dielectric double layered film on the dielectric film, having a first layer of amorphous silicon and a second layer of a material having a third refractive index, lower than a second refractive index, which is the refractive index of amorphous silicon, the first layer being closer to the dielectric film than the second layer, and having a thickness 1/4 of a second in-medium wavelength determined by the second refractive index and the wavelength of the emitted light, and the second layer having a thickness 1/4 of a third in-medium wavelength determined by the third refractive index and the wavelength of the emitted light.

2. The semiconductor laser device according to claim 1, comprising a plurality of the first dielectric double layered films.

* * * * *